United States Patent [19]
Tsuchiaki et al.

[11] Patent Number: 6,054,371
[45] Date of Patent: Apr. 25, 2000

[54] METHOD OF MANUFACTURING A SEMICONDUCTOR DEVICE BY DETACHABLY MOUNTING SUBSTRATES TO A HOLDER BOARD

[75] Inventors: Masakatsu Tsuchiaki, Tokyo; Yasushi Nakasaki, Yokohama; Akira Nishiyama, Yokohama; Yukihito Oowaki, Yokohama; Hirotaka Nishino, Yokohama, all of Japan

[73] Assignee: Kabushiki Kaisha Toshiba, Kawasaki, Japan

[21] Appl. No.: 09/162,155

[22] Filed: Sep. 29, 1998

[30] Foreign Application Priority Data

Sep. 29, 1997 [JP] Japan .................................. 9-263600

[51] Int. Cl.[7] .......................... H01L 21/30; H01L 21/46; H01L 21/00; H01L 21/84; H01L 21/44
[52] U.S. Cl. .......................... 438/458; 438/107; 438/155; 438/164
[58] Field of Search ...................................... 438/152, 155, 438/164, 275, 292, 406, 458, 588, 107; 257/391

[56] References Cited

U.S. PATENT DOCUMENTS 4,409,724  10/1983  Tasch ........................................ 438/30
5,032,543   7/1991  Black ...................................... 438/107
5,073,230  12/1991  Maracas .................................. 438/458
5,455,202  10/1995  Malloy .................................... 438/118
5,869,373   2/1999  Wen ....................................... 438/275

FOREIGN PATENT DOCUMENTS 5-63069     3/1993  Japan .
5-251601    9/1993  Japan .
6-151701    5/1994  Japan .
7-74328     3/1995  Japan .

*Primary Examiner*—Chandra Chaudhari
*Assistant Examiner*—Nema Berezny
*Attorney, Agent, or Firm*—Foley & Lardner

[57] ABSTRACT

Disclosed is a method of manufacturing a semiconductor device, comprising the step of detachably mounting a plurality of semiconductor substrates to a first holder board so as to form a complex semiconductor substrate, and the step of subjecting the plural semiconductor substrates included in the complex semiconductor substrates to common steps of manufacturing a semiconductor device. At least one of the plural semiconductor substrates is mounted to a second holder board. The particular semiconductor substrate is detached from the second holder board and, then, mounted to the first holder board. Alternatively, at least one of the plural semiconductor substrates is detached from the first holder board and, then, mounted to a third holder board differing in size from the first holder board.

28 Claims, 5 Drawing Sheets

METHOD OF MANUFACTURING A SEMICONDUCTOR DEVICE BY DETACHABLY MOUNTING SUBSTRATES TO A HOLDER BOARD

BACKGROUND OF THE INVENTION

The present invention relates to a method of manufacturing a semiconductor device, particularly, a semiconductor device using a complex type (combination type) substrate prepared by detachably mounting a plurality of semiconductor substrates to a holder board during the manufacturing process.

In recent years, the semiconductor substrate for forming a semiconductor device is being made larger and larger in an attempt to facilitate mass production of the semiconductor device and to pursue the reduction in the manufacturing cost of the semiconductor device. However, in compliance with the demands for the large scale integration of the semiconductor circuit device, the manufacturing steps and apparatus are made highly complex, with the result that it is difficult to carry out uniformly the highly controlled manufacturing steps over the large area of the semiconductor substrate.

In, for example, a RIE (Reactive Ion Etching) step for anisotropically etching a surface of a semiconductor substrate in a vertical direction, it is necessary to form a uniform plasma over the entire surface of the substrate in order to process a substrate having a large diameter, e.g., a diameter of 8 inches, 12 inches or more. For forming a uniform plasma over the entire surface of a large substrate, various problems must be solved. For example, it is necessary to design appropriately a vacuum chamber of a large size, a vacuum pump of a large capacity for maintaining vacuum within the vacuum chamber, a mechanism for uniformly introducing an etching gas into the vacuum chamber, a device for a power supply for forming a uniform plasma, a means for uniformly introducing the plasma over the entire surface of the substrate, and a vacuum system for exhausting by products formed by the etching without impairing the uniformity of the plasma. It is also necessary to develop a heat exchanger system for maintaining constant the substrate temperature.

As pointed out above, it was necessary to develop a new RIE apparatus differing from the previous model every time the diameter of the semiconductor substrate was made larger.

Similarly, in order to deposit or form uniformly a film of a semiconductor material, an insulating material or a metallic material on a semiconductor substrate having a large diameter, it is absolutely necessary to improve the manufacturing apparatus to permit supplying film-forming materials uniformly over a large area of the substrate surface and to permit carrying out the reaction of the film-forming materials uniformly on the semiconductor substrate.

Also, in the heat treating steps for oxidation, diffusion of the electrically conductive impurities and their activation, it is necessary to maintain the temperature uniform over the large area of the semiconductor substrate. Further, it is necessary to take measures for maintaining the concentration and flow rate of the ambient gas uniform over the large area of the substrate surface. To meet these requirements, re-designing of the heat treating furnace, the heater or the lamp is required.

What should also be noted is that, even if the substrate can be heated uniformly, crystal defects such as slips and dislocations tend to be induced if stress is generated by the weight of the substrate itself, making it necessary to re-model the wafer holding equipment and the like.

As described above, in order to cope with the enlargement of the semiconductor substrate, it is necessary to develop and introduce a new manufacturing apparatus capable of coping with the enlargement of the semiconductor substrate in the individual manufacturing steps. It follows that, even if it is intended to achieve mass production of a semiconductor device by using a substrate having a large diameter in an attempt to reduce the manufacturing cost of the semiconductor device, the manufacturing process cannot be completed unless every single step included in the manufacturing process is ready for coping with the enlargement.

Particularly, it is impossible to achieve mass production of a semiconductor device using a substrate having a diameter larger than the semiconductor substrate on which the device is initially developed in the research and development stage, if it is impossible to cope with a large substrate in every manufacturing process. It impairs a smooth transfer of the researched and developed attainment to mass production, resulting in inefficient return on investment in research and development. What should be noted is that an intensive capital investment and the depreciation accompanying the investment offset the merit of the reduction of the manufacturing cost obtained by the improved productivity achieved by enlargement of the substrate.

In addition, it is technically difficult to manufacture a semiconductor substrate free from crystal defects over a large area of the substrate. When it comes to the CZ method, control of the heat flow within a melt and effect of the cooling after the crystal growth must also be taken into account. Heat tends to be confined within the crystal with increase in the diameter of the semiconductor substrate, leaving the substrate prone to oxygen precipitation. Also, it is necessary to polish flat the substrate surface over a large area. Such being the situation, it is unavoidable for the unit cost of the semiconductor substrate having a large diameter to be made higher and higher.

Further, in the conventional method of manufacturing a semiconductor device using a semiconductor substrate having a large diameter, where a process is not completed as intended in a part of a semiconductor substrate so as to give rise to defective regions or device malfunction, or where metal or other fine particles contaminate a part of the substrate it was unavoidable to discard the substrate with all the other functioning devices formed. Alternatively, it was unavoidable to continue the manufacturing process although the processes are to be performed in vain to some of the semiconductor devices which would fail to function. Particularly, where various functions are achieved on a single semiconductor substrate (System on Chip), or where an electronic circuit performing various functions is formed over the entire region of a semiconductor substrate (Wafer Scale Integration), the conventional manufacturing method is expected to be very low in yield.

For example, a one-chip system is known in which a memory function and a logic function for performing an arithmetic operation are formed on a single semiconductor substrate. In this case, the MOSFET performing the memory function is required to have a channel region having a high impurity concentration and a thick gate oxide film. On the other hand, the MOSFET included in the logic section is required to have a channel region having a low impurity concentration and a thin gate oxide film. Where electronic circuits widely differing from each other in the required function are formed on the same semiconductor substrate as in the one-chip system noted above, the conventional manufacturing process gives rise to a serious problem that the manufacturing steps are increased for achieving the various functions, leading to a high manufacturing cost.

As described above, even if it is intended to reduce the manufacturing cost of a semiconductor device by using a semiconductor substrate having a large diameter, it is necessary to develop and introduce a fresh new manufacturing apparatus capable of processing the large semiconductor substrate. In addition, where a semiconductor substrate having a large diameter is used for mass production of a semiconductor device, it is necessary to cope with use of a large semiconductor substrate in every single manufacturing step, leading to requirement of a intensive capital investment. Further, where a semiconductor substrate having a diameter larger than that of the semiconductor substrate used in the stage of the research and development is used for mass production of a semiconductor device, the efficiency of the research and development is impaired. These economical losses offset the merit of the improved productivity achieved by the use of a semiconductor substrate having a large diameter.

In addition, it is technically difficult to prepare a semiconductor substrate itself free from crystal defects over a large area of the substrate, leading to a high unit cost of the semiconductor substrate having a large diameter.

Further, where flaw or miscarriage such as incompletion of a certain process has taken place in a part of the semiconductor substrate, the defective part makes it unavoidable to discard the other satisfactory part of the semiconductor device or to continue to apply the subsequent manufacturing steps to even the inoperable devices leading to a low yield.

Still further, where common manufacturing steps are employed for achieving a one-chip system, the number of manufacturing steps is increased and the manufacturing step is made complex, leading to a high manufacturing cost.

BRIEF SUMMARY OF THE INVENTION

An object of the present invention is to provide a method of manufacturing a semiconductor device, which permits mass production of the semiconductor device even if measures for coping with use of a semiconductor substrate having a large diameter are not completed in every manufacturing step. The present invention also intends to suppress the increase in the unit cost of the semiconductor substrate accompanying the increase in diameter while enjoying the merit of the improved productivity associated with the increase in the diameter of the semiconductor substrate as much as possible.

Another object is to provide a method of manufacturing a semiconductor device, in which, when miscarriage has taken place in a part of the semiconductor substrate, it is unnecessary to discard all the other functional semiconductor devices or to continue to apply a costly manufacturing step to the inoperable semiconductor device, so as to improve the productivity and yield of the semiconductor device.

Further, still another object of the present invention is to provide a method of manufacturing a semiconductor device, which permits manufacturing a multi-functional electronic circuit device such as a one-chip system at a low manufacturing cost without increasing the manufacturing steps and without making the manufacturing step complex.

According to an aspect of the present invention, there is provided a method of manufacturing a semiconductor device, comprising the step of detachably mounting a plurality of semiconductor substrates to a first holder board so as to prepare a complex semiconductor substrate, and the step of subjecting the plural semiconductor substrates included in the complex semiconductor substrate to common steps of manufacturing a semiconductor element.

The method of the present invention for manufacturing a semiconductor device, in which at least one of the plural semiconductor substrates is mounted to a second holder board, further comprises the step of subjecting the semiconductor substrate mounted to the second holder board to a manufacturing process of a semiconductor element, the step of detaching the semiconductor substrate subjected to the manufacturing process of a semiconductor element from the second holder board, and the step of bonding the semiconductor substrate detached from the second holder board to the first holder board so as to form the complex semiconductor substrate.

What should also be noted is that the method of the present invention for manufacturing a semiconductor device further comprises the step of detaching at least one of the plural semiconductor substrates from the first holder board, the step of bonding the semiconductor substrate detached from the first holder board to a third holder board, and the step of subjecting the semiconductor substrate bonded to third holder board to a manufacturing process of a semiconductor element.

According to another aspect of the present invention, there is provided a method of manufacturing a semiconductor device, comprising the step of mounting a plurality of semiconductor substrates electrically insulated from each other to a holder board so as to prepare a complex semiconductor substrate, and the step of independently controlling the electromagnetic potentials of the plural semiconductor substrates included in the complex semiconductor substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

Figure 1:
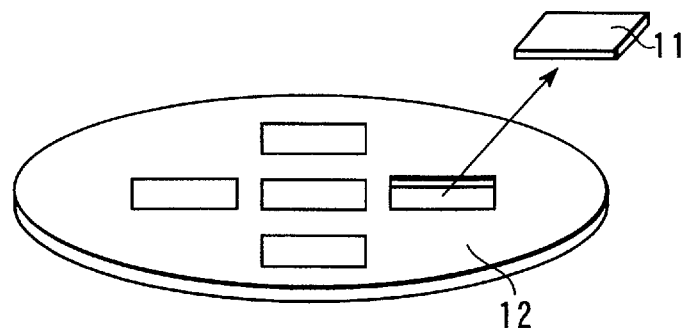
FIG. 1 shows a concept of a complex semiconductor substrate including a holder board for holding a plurality of semiconductor substrates.

There will now be describe a method of the present invention for manufacturing a semiconductor device with reference to FIG. 1.

As shown in the drawing, a plurality of semiconductor substrates 11 on which semiconductor elements are to be formed are held by a holder board 12. The semiconductor substrate 11, which is detachable from the holder board 12, is mounted to or detached from the holder board 12 as desired during the manufacturing process of a semiconductor device.

For example, where a manufacturing process of a semiconductor device is applied to a plurality of semiconductor substrates 11 held on the holder board 12 having a large diameter, a certain process of the manufacturing may not be applicable for the large holder as is. In this case, it is possible to detach the semiconductor substrates 11 from the holder board 12 and mount again these substrates 11 to another holder board having a smaller diameter for carrying out the particular steps of the manufacturing process.

Further, in the manufacturing steps in which the holder board 12 of the large diameter can be used, the semiconductor substrates 11 are better mounted again to the holder board 12 so as to achieve a high productivity. Obviously, in the mass production of a semiconductor device, the through put can be improved by applying process steps collectively to as many devices an area as large as possible.

It should also be noted that the mass production facility need not be renewed in the present invention every time the diameter of the wafer is enlarged. Since there is no need to synchronize the renewal in concert with the introduction of larger wafer, the capital investment can be maneuvered freely. Further, since the newly developed semiconductor device can be transferred to a mass production smoothly, from R and D stage it is possible to improve the efficiency of the research and development.

It should also be noted that the holder board 12 can be used repeatedly in the manufacturing facilities and manufacturing apparatuses. Therefore, manufacture of a semiconductor device can be actually carried out continuously by replenishing a small semiconductor substrate 11 on which a semiconductor device is to be formed. Since the small semiconductor substrate 11 is easier to fabricate compared with the large semiconductor substrate, it is possible to avoid an increase in the unit area cost of the semiconductor substrate.

In addition, where miscarriage has taken place in some of the semiconductor substrates during the manufacturing process, or where metals or other fine particles contaminates some of the substrates, the particular semiconductor substrate 11 can be detached from the holder board 12 and another flawless semiconductor substrate 11 can be mounted again to the holder board 12. It entails that the presence of a defective semiconductor substrate does not require the other satisfactory semiconductor substrates to be discarded entirely. Otherwise, a costly semiconductor manufacturing process need not be applied to a semiconductor substrate where the manufactured semiconductor device is expected to be inoperable. It follows that the method of the present invention permits markedly improving the yield and productivity.

Particularly, when it comes to a system-on-chip apparatus having various functions achieved on a single chip or a wafer scale integration apparatus constituting a multifunctional electronic circuit, the yield can be drastically improved by separating and discarding appropriately the defective portions and substituting therefor satisfactory portions.

In the manufacture of a one chip type semiconductor device, the semiconductor substrates 11 on which distinct functions are to be achieved are separated in advance. In the manufacturing step which is difficult to be carried out commonly, these semiconductor substrates 11 are mounted to different holder boards 12. In the manufacturing step which can be carried out commonly, these semiconductor substrates are mounted to the same holder board 12. Thus the one chip type semiconductor device can be manufactured at a low cost without increasing the manufacturing steps and avoiding the complexity of process steps incurred by conflicting specifications to realize vastly different circuit functions on a single solid substrate.

Summarized below are preferred modes of the method of the present invention for manufacturing a semiconductor device.

(1) The semiconductor substrate comprises an upper semiconductor substrate having a main surface on which a semiconductor device is to be formed, a lower semiconductor substrate, and an insulating layer interposed between the upper and lower semiconductor substrates. Therefore, even if a crystal defect such as dislocation generated from the bonding, the crystal defect does not reach to the upper semiconductor substrate on which a semiconductor device is to be formed. It follows that the electrical characteristics of the semiconductor device are not impaired.

(2) The holder board is formed of a material identical to the material of the lower semiconductor substrate. Therefore, the bonded portion between the holder board and the lower semiconductor substrate is thermally expanded at the rate, making it possible to suppress the stress generation at the joint. Hence, it is possible to suppress introduction of the crystal defect into the semiconductor substrate.

(3) The semiconductor substrate is mounted to the holder board with an insulating film interposed therebetween. Therefore, the holder board and each of the semiconductor substrates are electrically insulated from each other, making it possible to apply independently a electric potential and current to each of the semiconductor substrates. It follows that it is possible to locally adjust the plasma potential in RIE and apply Joule heating.

(4) The insulating film at the joint between the holder board and the semiconductor substrate is formed of a silicon oxide film. The silicon oxide film enables a strong bonding between the holder board and the semiconductor substrate. In addition, the semiconductor substrate can be readily detached from the holder board by subjecting the insulating film to a wet treatment with, for example, HF.

(5) An intermolecular force is utilized for the bonding between the semiconductor substrate and the holder board. As a result, the semiconductor substrate can be mounted to and detached from the holder board easily. In addition, the mounting portion of the holder board can be used repeatedly.

(6) A thin silicon oxide film having a hydrophilic surface is formed on any of the semiconductor substrate to be mounted and the holder board. As a result, the semiconductor substrate can be mounted to the holder board without applying an external force. Since a heat treatment need not be applied to the semiconductor substrate, the semiconductor substrate is substantially free from an adverse effect even if a semiconductor element is already formed partly on the semiconductor substrate.

(7) A silicon layer is formed on any of the semiconductor substrate to be mounted and the holder board, followed by converting the silicon layer into an oxide film. As a result, the semiconductor substrate is strongly bonded to the holder board by covalent bond.

(8) Any of the semiconductor substrate to be mounted and the holder board is coated with a silicon oxide substance imparted fluidity, followed by a heat treatment. As a result, bonding by covalent bond can be obtained at low temperatures.

(9) Fine particles consisting of silicon oxide substance are attached to any of the semiconductor substrate to be mounted and the holder board, followed by compressing the semiconductor substrate and the holder board. As a result, it is possible to obtain bonding by intermolecular force without employing a heat treatment.

(10) Covalent bond is utilized for the bonding, making it possible to increase the bonding strength.

(11) Hydrogen bond including OH group is utilized for the bonding, making it possible to bond the semiconductor substrate to the holder board without applying an external force. Since it is unnecessary to apply a heat treatment to the semiconductor substrate, the semiconductor element formed in the semiconductor substrate is substantially free from an adverse effect.

(12) A heat treatment is applied to bring about dehydration so as to convert the hydrogen bond including OH group into a chemical covalent bond. As a result, a strong bonding can be obtained without substantially affecting the semiconductor device formed on the semiconductor substrate.

(13) The insulating film at the joint between the semiconductor substrate and the holder board is etched from the back surface of the semiconductor substrate, making it possible to detach easily the semiconductor substrate from the holder board.

(14) The holder board is formed of a material having a thermal expansion coefficient equal to that of the semiconductor substrate, making it possible to suppress stress build up from the difference in thermal expansion coefficient between the two. It follows that it is possible to suppress introduction of defects into the semiconductor substrate.

(15) A semiconductor device comprising a plurality of semiconductor substrates is formed as a single chip, making it possible to manufacture a one-chip type semiconductor device with a simple manufacturing process.

(16) Provided is a method of manufacturing a semiconductor device comprising the step of preparing a composite semiconductor substrate by mounting a plurality of semiconductor substrate to a holder board such that these semiconductor substrates are electrically insulated from each other, and the step of independently adjusting the electric potentials of the plural semiconductor substrates included in the composite semiconductor substrate. The particular method makes it possible to apply independently a heat treatment by Joule heating to each of the plural semiconductor substrates.

There will be described specific embodiments of the present invention with reference to the accompanying drawings.

Figure 2:
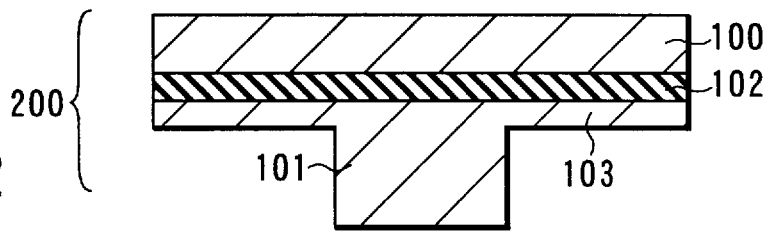
FIG. 2 is a cross sectional view showing an SOI semiconductor substrate comprising an upper silicon substrate, a lower silicon substrate having an outer peripheral portion cut away, and an insulating film interposed between the upper and lower silicon substrates.

First of all, let us describe the semiconductor substrate used in the method of the present invention. Specifically, FIG. 2 is a cross sectional view showing a semiconductor substrate 200 prepared by a known method. As shown in the drawing, the semiconductor substrate 200 is of an SOI structure consisting of an upper silicon substrate 100 on a main surface of which a semiconductor device is to be formed, a lower silicon substrate 101, and an insulating film 102 interposed between the upper silicon substrate 100 and the lower silicon substrate 101 and consisting of, for example, a silicon oxide film.

The outer peripheral portion 103 of the lower silicon substrate 101 is partly cut away by a known method such as lapping or RIE. The upper silicon substrate 100 can be shaped to conform with the shape of the final semiconductor device (chip), e.g., a rectangular shape sized at 15 mm×15 mm, so as to obtain a maximum yield and productivity. Of course, the upper silicon substrate 100 need not conform with the shape of a final single chip. The shape of the upper silicon substrate 100 can be modified concordant with, for example, the shape of the basic functional block within the chip. It is also possible to form a plurality of devices on the upper silicon substrate 100.

Figure 3A:
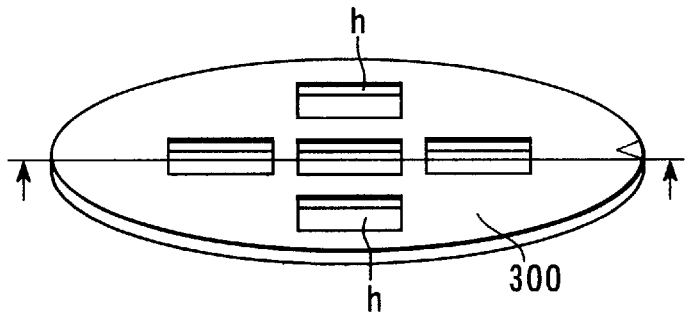
FIG. 3A is an oblique view showing a holder board.

Next, let us describe the holder board for holding the semiconductor substrate. Specifically, FIG. 3A is an oblique view exemplifying a holder board 300 for holding the semiconductor substrate 200 shown in FIG. 2. It is desirable for the material of the holder board 300 to have equal or close the thermal properties such as the thermal expansion coefficient to that of the semiconductor substrate 200, particularly, the lower silicon substrate 101 having a bonding portion with the holder board 300. For example, if the holder board 300 is formed of silicon, the thermal expansion coefficient of the holder board 300 is equal to that of the lower silicon substrate.

The holder board is appropriately shaped to conform with the manufacturing apparatus. Where, for example, a treatment within a RIE apparatus designed for 8" wafer is to be applied to the semiconductor substrate, the holder board should be in the form of a disc having a diameter of 8 inches. A disc-like silicon substrate having a diameter of 8 inches can be prepared by the conventional technology of forming a silicon wafer of a large diameter. It should be noted, however, that the holder board need not consist of a single crystal. For example, it is possible to use a polycrystalline silicon substrate as the holder board.

Figure 3B:
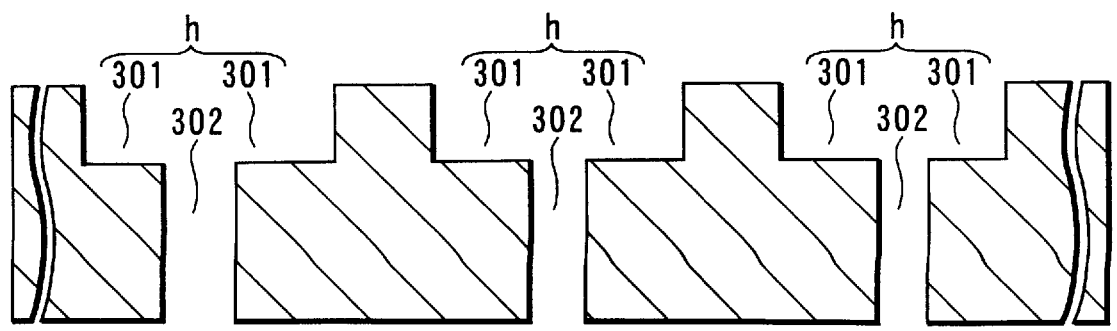
FIG. 3B is a partial magnified cross sectional view showing the holder board shown in FIG. 3A.

For an example for holder fabrication a silicon oxide film or other mask material such as a resist is formed in a desired pattern on a surface of the silicon disk 300 by lithography followed by removing the surface region of the holder board in a depth corresponding to the thickness in the outer peripheral portion 103 of the semiconductor substrate 200 by the known method such as RIE, a wet etching using a mixed etchant of HF/HNO$_3$, or a CDE method so as to form a groove 301. Then, the formation of the mask material and the etching treatment are similarly repeated to remove a part of the groove 301 to reach the back surface of the holder board so as to form a through-hole 302. FIG. 3B is a cross sectional view of the holder board 300 at this stage along the line IIIB—IIIB shown in FIG. 3A.

Figure 4A:
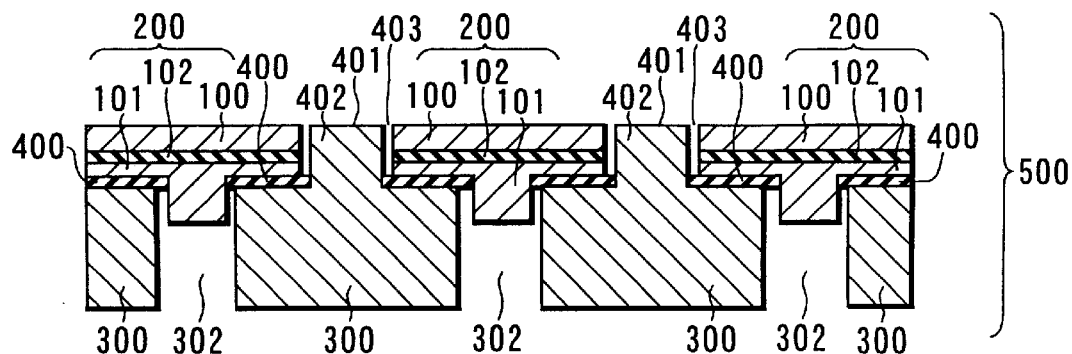
FIG. 4A is a partial cross sectional view showing a complex semiconductor substrate obtained by mounting a semiconductor substrate to a holder board.

FIG. 4A shows how the semiconductor substrate 200 is bonded to the holder board 300 prepared as described above. Specifically, a thin oxide film 400 is formed on at least one of the holder board 300 and the outer peripheral portion 103 of the lower silicon substrate 101 by the treatment with a mixed solution of HCl/H$_2$O$_2$, followed by mounting the semiconductor substrate 200 to the open portion h of the holder board 300.

Hydrogen bonding is formed by the OH group present on the hydrophilic surface, of the oxide film 400. Under the particular condition, the semiconductor substrate 200 can be bonded to the holder board without applying an external force. Since a heat treatment need not be applied to the semiconductor substrate 200 in this case, the semiconductor devices formed on the semiconductor substrate 200 is not substantially affected by the bonding even if the semiconductor devices are already formed partly in the semiconductor substrate 200.

It should also be noted that the insulating film 102 is formed between the bonding surface of the semiconductor substrate 200 and the upper silicon substrate 100 on which a semiconductor device is to be formed. It follows that, even if crystal defects are generated from the joint, these crystal defects are not transmitted into the upper silicon substrate 100.

The Bonding can be achieved in another way. The thin oxide film 400 having a thickness of about, for example, 100 Å is formed by thermally oxidizing the holder board 300. On the other hand, the outer peripheral portion 103 of the lower silicon substrate 101 is treated with, for example, a mixed solution of HCl/H$_2$O$_2$ so as to form a thin oxide film on the surface of the outer peripheral portion 103. Under this condition, the semiconductor substrate 200 can be mounted to the open portion h of the holder board 300 so as to achieve bonding thereof.

The bonding in this case is also based on the hydrogen bond formed by the OH group present on the hydrophilic surfaces of the oxide film formed on the surface of the outer peripheral portion 103 of the lower silicon substrate 101. Under this condition, the semiconductor substrate 200 can be bonded to the holder board 300 without applying an external force. Since a heat treatment need not be applied to the semiconductor substrate 200 in this case, the semiconductor device formed on the semiconductor substrate 200 is not substantially affected by the bonding.

Further, even if crystal defects are generated from the junction between the holder board 300 and the outer peripheral portion 103 of the lower silicon substrate 100, upper silicon substrate 100 stays immune to the defects because of the insulating film 102.

Evidently, it is possible to form a thin oxide film having a thickness of, for example, about 100 Å by thermally oxidizing a region including the outer peripheral portion 103 of the lower silicon substrate 101. On the other hand, the holder board 300 is treated with a mixed solution of HCl/H$_2$O$_2$ to form a thin oxide film. Under this condition, the semiconductor substrate 200 is mounted on the open portion h of the holder board 300 so as to achieve bonding thereof.

In order to further solidify the bonding, one can apply a heat treatment at 200° C. or more, preferably at 200 to 400° C., after the semiconductor substrate 200 is mounted to the holder board 300. The heat treatment brings about a dehydration between Si and OH group, converting the bond at the interface into a Si—O—Si bond, which is a solid chemical covalent bonding. At this low temperature about 200 to 400° C., the semiconductor device, even if formed partly on the semiconductor substrate 200, is not substantially affected.

In another bonding method, a thin silicon layer is formed by a known method such as sputtering in a region including the outer peripheral portion 103 of the lower silicon substrate 101. On the other hand, the holder board 300 is treated with, for example, a mixed solution of HCl/H$_2$O$_2$ to form a thin oxide film. Under this condition, the semiconductor substrate 200 is bonded under pressure to the holder board 300, followed by applying a heat treatment under an oxidizing atmosphere. As a result, the thin silicon film formed on the lower silicon substrate 101 is converted into the oxide film 400, thereby achieving the bonding between the two. The bonding in this case is based on a chemical bond.

If desired, the heat treatment can be applied locally to the joint between the semiconductor substrate 200 and the holder board 300 using a laser illumination. It is also possible to employ a rapid thermal annealing. As a way of heating the joint since the semiconductor substrates 200 are electrically insulated from each other, the Joule heating can be applied independently to each of the semiconductor substrates 200.

It is also possible to carry out the bonding between the semiconductor substrate 200 and the holder board 300 by using a flowable silicon oxide material such as SOG (Spin on Glass), (i.e. silicon compounds R$_n$Si(OH)$_{4-n}$, and additives). To be more specific, the outer peripheral portion 103 of the lower silicon substrate 101 or the holder board 300 is coated with the particular silicon oxide material by means of, for example, a rotary coating using a spinner, followed by mounting the semiconductor substrate 200 to the open portion h of the holder board 300. Afterwards, a heat treatment is applied for about 30 minutes at 300° C. under, for example, a nitrogen gas atmosphere so as to remove the components other than those for forming a silicon oxide film. As a result, the oxide film 400 is formed between the outer peripheral portion 103 of the lower silicon substrate 101 and the holder board 300. The bonding in this case is a chemical bonding.

Since the upper silicon substrate 100 is thermally insulated by the insulating film 102 from the joint between the holder board 300 and the lower silicon substrate 101, the heat treatment can be accomplished without affecting the semiconductor device, even if formed partly in the upper silicon substrate 100. Similarly the semiconductor device stays immune to crystal defect originated in 101.

In a still another bonding method between the semiconductor substrate 200 and the holder board 300, fine particles having a diameter of about 1,000 Å, which are covered with a silicon oxide film containing OH group, are generated by, for example, a gas evaporation method, i.e., by irradiating a silicon target with a laser beam. These fine particles are attached to at least one of the outer peripheral portion 103 of the lower silicon substrate 101 and the holder board 300, followed by mounting under pressure the semiconductor substrate 200 to the open portion h of the holder board 300 so as to achieve bonding between the semiconductor substrate 200 and the holder board 300.

In the case of using fine particles, the surface area is increased so as to improve the reactivity between the fine particles and 103 or 300. The bonding in this case is based on the intermolecular force and chemical bond. In this case, a heat treatment need not be applied to the semiconductor substrate 200. Semiconductor devices, even if formed partly on the upper silicon substrate 100, stay intact. Also, since the insulating film 102 is formed between the upper silicon substrate 100 and the joint between the outer peripheral portion 103 of the lower silicon substrate 101 and the holder board 103, the crystal defect, even if generated from the joint, casts no harm to the upper silicon substrate 100.

In addition to each of the bonding steps described above, it is possible to form a plurality of grooves (not shown) in the oxide film 400 by a known method such as lithography or RIE in order to promote the etching of the oxide film 400 in the step of detaching the semiconductor substrate 200 from the holder board 300.

For all of the above bonding cases, apparently, it is desirable to use a mechanical apparatus with a high positioning accuracy and alignment capability in mounting the semiconductor substrate 200 to the holder board 300. In the mounting step of the semiconductor substrate 200, it is effective to put a mark on, for example, the back surface of the holder board 300 in order to mount the semiconductor substrate 200 accurately as desired to the holder board 300.

It is also desirable to make an upper surface of the upper silicon substrate 100 flush with an upper surface 402 of the holder board 300, as shown in FIG. 4A. Since a convex portion 401 of the holder board 300 is interposed between two adjacent semiconductor substrates 200, the plasma potential is prevented from being disturbed in the peripheral portion of the semiconductor substrate 200 in carrying out a plasma treatment such as RIE, so that a main surface of the semiconductor substrate 200 can be processed uniformly.

It should also be noted that a small clearance 403 is formed between the semiconductor substrate 200 and the convex portion 402 of the holder board 300. With the clearance, even if the holder board 300 is thermally deformed during the heat treatment, the thermal deformation is absorbed by the clearance 403, so that the stress is prevented from propagating directly to the semiconductor substrate 200.

Besides, the individual semiconductor substrates 200 are electrically insulated by the silicon oxide film 400. In addition, the holder board 300 is provided with through-holes 302 reaching to the back surface. It follows that electrical voltages can be applied independently to each of the semiconductor substrates 200 during the manufacturing process of a semiconductor device on the surface of the upper silicon substrate 100. Uniform RIE etching can be achieved over the entire region of the holder board 300 by correcting the non-uniformity of the plasma potential through voltages independently applied to each of the semiconductor substrates 200. This is also effective for facilitating the development itself of an etching apparatus of a large area.

In addition, it is effective to avoid a large scale charging damage caused by the non-uniformity of the plasma density, which takes place during the plasma processing such as a magnetic enhanced RIE, because the individual semiconductor substrates 200 are electrically insulated from each other by the silicon oxide film 400 in the present invention.

Further, since a voltage can be applied independently to each of the semiconductor substrates 200 as described previously, it is possible to apply independently to each of the semiconductor substrates 200 a Joule heating effective for forming a very shallow pn junction which is required in accordance with miniaturization of the semiconductor device. Current path can be locally controlled within the substrate rather than allowing the current to flow over the entire holder. It allows fine tuning of the temperature locally, thus, leading to uniform heating over the entire holder.

In applying a lithography step to the complex substrate prepared by bonding the semiconductor substrate 200 to the holder board 300, it is desirable to put alignment marks on, for example, the four corners of the semiconductor substrate 200 so as to permit the focus control for each of the semiconductor substrates 200. It is also effective to make the axes of the optical system or the orientates of the pedestal finely adjustable. In practice, the lithography process is not performed over the entire substrate surface. Therefore, the fine control mechanism is similarly required in the conventional method of lithography using a semiconductor substrate of a large diameter in place of the composite substrate as in the present invention.

Figure 4B:
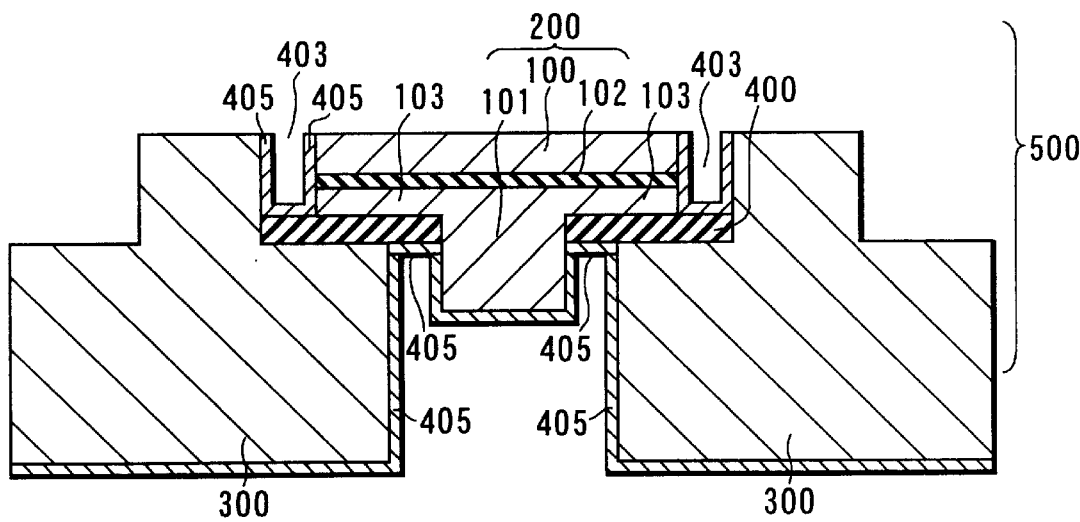
FIG. 4B is a partial cross sectional view showing a complex semiconductor substrate having a protective film formed in the vicinity of the joints between substrates and holder board.

In order to protect the material formed in the joint which is selectively removable from silicon, e.g., the silicon oxide film 400, in the subsequent process steps, it is effective to form a protective film 405 made of, for example, silicon nitride on the back surface of the composite substrate 500 and in the clearance 403. FIG. 4B is a cross sectional view showing in a magnified fashion the joint having the protective film 405 formed therein. In the case of forming the protective film 405, a wet treatment using, for example, an HF solution can be carried out freely.

Figure 5:
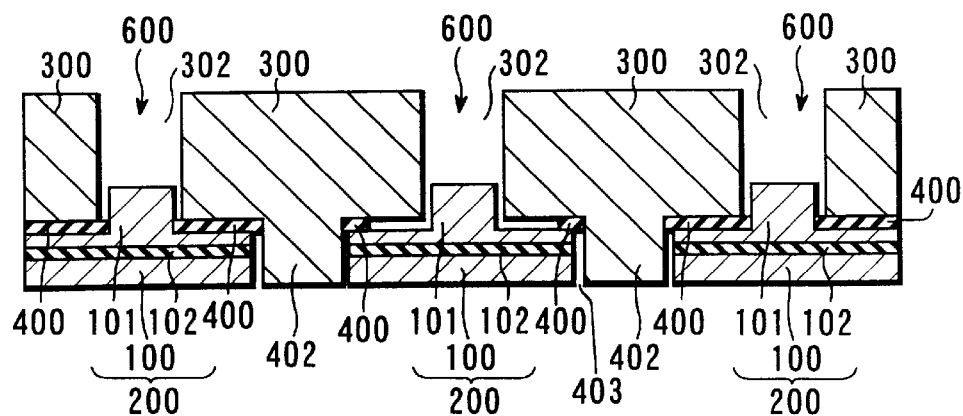
FIG. 5 shows the concept relating to detachment of a semiconductor substrate from a holder board.

Now, let us describe how to detach the semiconductor substrate 200 from the holder board 300 with reference to a partial cross sectional view shown in FIG. 5. For facilitating the description, the drawing is turned upside down in FIG. 5, compared with the drawings shown in FIGS. 4A and 4B. As shown in FIG. 5, the oxide film 400 is formed between the holder substrate 300 and the semiconductor substrate 200.

For detaching a desired semiconductor substrate 200 from the holder board 300, a solution 600 such as an HF solution, which is capable of selectively removing the oxide film 400, is selectively poured into a hole 302 of the holder board 300 so as to etch the oxide film 400. As a result, the desired semiconductor substrate 200 can be selectively detached from the holder board 300.

If the protective film 405 is formed on the back surface of the composite substrate as shown in FIG. 4B or where a semiconductor film, an insulating film, a metal film, etc. are formed after the bonding of the semiconductor substrate 200 to the holder board 300, these films are removed by a known method such as RIE or a wet etching treatment so as to make it possible to bring an etchant into direct contact with a part of the back surface of the oxide film 400.

In addition, if a film required for the manufacture of a semiconductor device is left unremoved in the clearance 403, this particular film can be removed by, for example, a RIE method or a wet etching treatment using a mask layer formed by a known effective method such as a lithography method to have an opening conforming with the clearance 403. The step of removing the particular film can be performed whenever desired during the manufacturing process of a semiconductor device on the main surface of the upper silicon substrate 100.

It is possible for the step of separating the semiconductor substrate 200 from the composite semiconductor substrate to include a step of applying a physical force or a local heat treatment in addition to the etching treatment described above.

After some or all semiconductor substrates 200 have been detached by the method described above, it is possible to mount new semiconductor substrates 200 to the holder board 300 whenever desired even during the manufacturing process of a semiconductor device. Likewise, the semiconductor substrate 200 can be separated whenever desired from the holder board 300 so as to be mounted again to a new holder board 300 even during the manufacturing process of a semiconductor device.

For example, where an assigned process step is not completed in a part of the semiconductor substrate as intended so as to give rise to a defective region in one of the semiconductor substrates or where metallic contamination has taken place in one of the semiconductor substrates, it is possible to detach the semiconductor substrate having the defective region from the holder board and to mount again a defect free semiconductor substrate to the holder board. It follows that it is unnecessary to discard an entire semiconductor device because of a small defective portion therein. It is also unnecessary to apply uselessly a costly manufacturing process to a semiconductor device which is eventually inoperable after completion of the manufacturing process. Clearly the method of the present invention permits markedly improving the yield and productivity of a semiconductor device.

Particularly, when it comes to a system on chip in which various functions are to be achieved on a single chip and, further, a wafer scale integration device in which a multi-functional electronic circuit is to be formed over the entire chip, the yield can be drastically improved by removing appropriately the defective portion and replacing for the defective portion with a satisfactory portion.

Figure 6A:
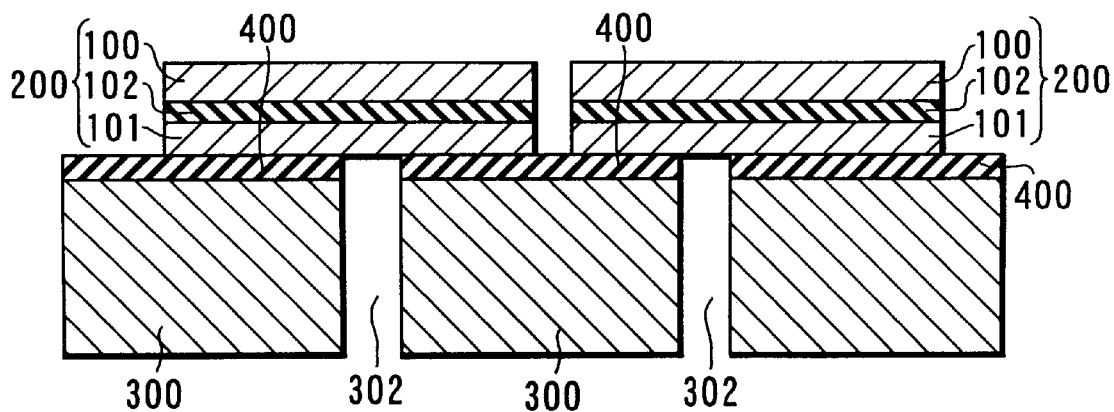
FIGS. 6A and 6B are cross sectional views showing other examples of mounting a semiconductor substrate to a holder board.
Figure 6B:
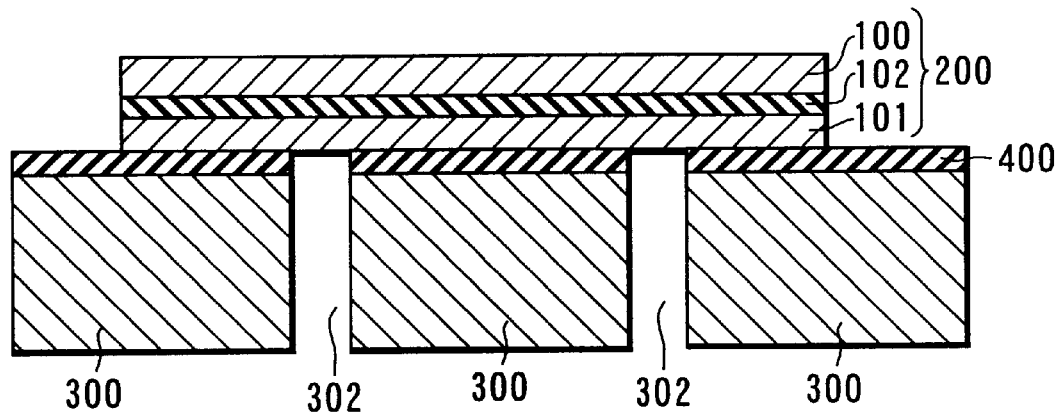
Figure 7:
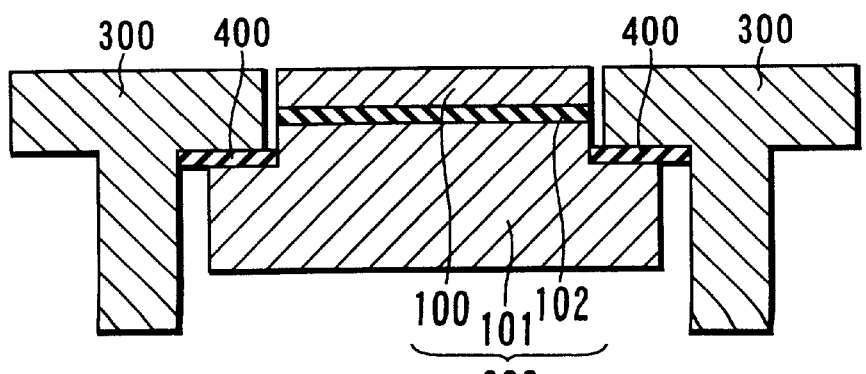
FIG. 7 is a cross sectional view showing another example of bonding a semiconductor substrate to a holder board.

Let us provide another bonding example differing from the previous bonding method in the shape of the holder board with reference to FIGS. 6A, 6B and 7.

Specifically, FIG. 6A is a cross sectional view showing the bonding portion between a holder board 300 whose outer peripheral portion is not processed and a semiconductor substrate 200. Such a simple bonding as shown in the drawing can be employed in the process step which does not involve irradiation of a main surface of a semiconductor substrate with plasma as in, for example, a RIE method.

FIG. 6B is a cross sectional view showing a bonding portion between a holder board 300 whose outer peripheral portion is not processed and a semiconductor substrate 200, said holder board 300 being provided with a plurality of holes 302 relative to a single semiconductor substrate 200. In this case, the total bonding area for a single semiconductor substrate 200 can be increased while the bonding area per a single hole 302 remains small, with the result that it is possible to maintain a satisfactory mechanical strength of bonding. In this example, the total area of the bonding portion can be determined at will keeping the bonding area per hole constant thus, certifying easy removal of the substrate. Also, the bonding portion is not limited to the outer peripheral portion of the semiconductor substrate 200.

FIG. 7 is a partial cross sectional view showing the bonding portion of a semiconductor substrate 200 which is bonded to the lower surface of a holder board 300. The particular bonding technique shown in the drawing facilitates an electrical or mechanical contact with the lower silicon substrate 101, with the result that a local Joule heating and an independent voltage application can be achieved without difficulty.

In the embodiment described above, the semiconductor substrate 200 is made of silicon. However, the semiconductor substrate used in the method of the present invention is not limited to a silicon substrate. Specifically, it is possible for the semiconductor substrate 200 to contain partially or in the entire region SiC, SiGe or a III–V group compound semiconductor material. Further, it is not absolutely necessary for the semiconductor substrate 200 to have an SOI structure. In other words, it is possible to use a semiconductor substrate consisting of a single material, where sufficient measures are taken in the bonding step against emergence of defects such as dislocation.

It should also be noted that the holder board can be used repeatedly in a manufacturing facility or manufacturing apparatus. Therefore, manufacture of a semiconductor device can be carried out continuously by simply replenishing small semiconductor substrates. A semiconductor substrate of a small area can be manufactured with a high yield, compared with a semiconductor substrate of a large area. An increase in the unit cost of the semiconductor substrate accompanying the increase in the diameter of the semiconductor substrate can be avoided while enjoying as much as possible the merit of the improved productivity by the simultaneous processing applied to a large area.

In some cases, an insulating material can be used for forming the holder board. With an insulating holder board an electrically conductive material can be used for the joint formation.

The composite substrate described above comprises a plurality of semiconductor substrates 200 on which semiconductor devices are to be formed and a holder board 300 supporting these plural semiconductor substrates 200. In the composite substrate, the semiconductor substrates can be independently mounted to or detached from the holder board at will.

Let us describe a method of manufacturing a semiconductor device by using the particular composite substrate with reference to FIGS. 8A to 10B.

In the case where a multi-functional electronic circuit is formed over an entire chip, or where a plurality of electronic circuits widely differing from each other in the required function such as a memory circuit and a logic circuit are formed on a single chip, commonality of the process steps for achieving different functions is lost because of conflicting specification on the process steps composed by the individual functions. The forming a single function on a single substrate manufacturing steps, in which the commonality is lost can be carried out by holding the semiconductor substrates on different holder boards. Afterwards, these semiconductor substrates are held together on a single holder board where common manufacturing steps can be applied so as to achieve finally a one-chip device.

Particularly, the method of the present invention enables easy manufacture of a semiconductor device including both memory and logic sections without increasing the manufacturing cost, i.e., a semiconductor circuit in which a MOSFET having a high impurity concentration in the channel region and a thick gate oxide film is formed in a semiconductor region constituting a DRAM, and another MOSFET having a lower impurity concentration in the channel region and a thinner gate oxide film is formed in another semiconductor region constituting a logic circuit.

Figure 8B:
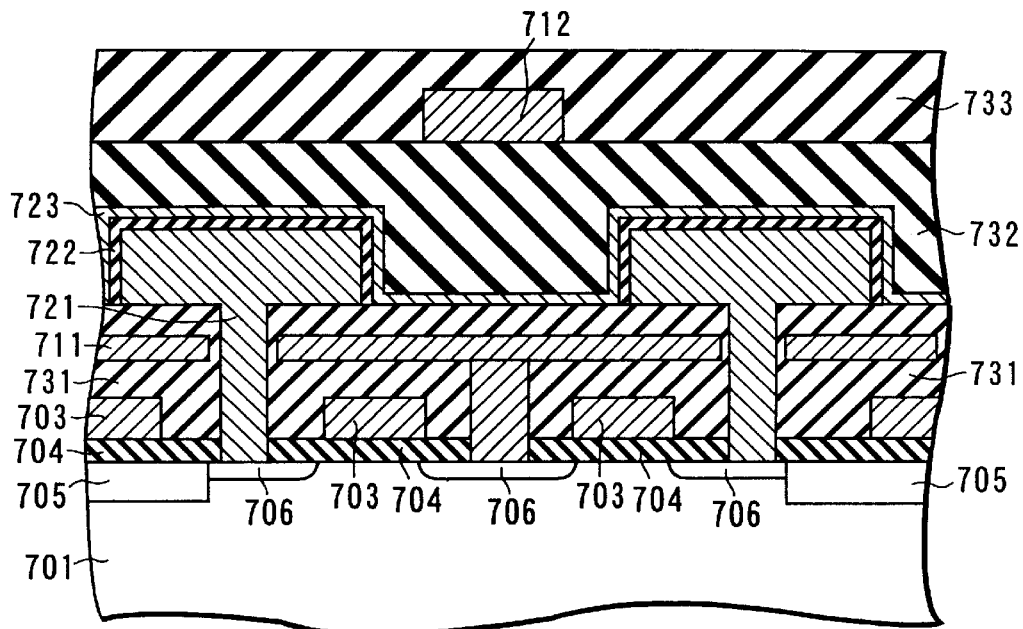
FIG. 8B is a partial cross sectional view showing a semiconductor substrate on which a semiconductor device having a memory function is formed.
Figure 8A:
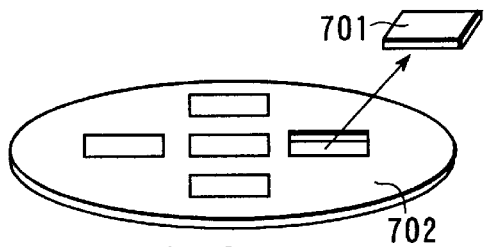
FIG. 8A is an oblique view showing a holder board.

FIG. 8A shows a semiconductor substrate 701 mounted to a holder board 702. On the other hand, FIG. 8B is a partial cross sectional view of a DRAM with static capacitors on a main surface of the semiconductor substrate 701 formed by a known method. Let us describe how to manufacture the DRAM section with reference to FIGS. 8A and 8B.

In the first step, an device isolation film 705 is formed by a shallow trench isolation technique on a main surface of the semiconductor substrate 701, followed by forming a thick gate oxide film 704 and a gate electrode 703 for a DRAM, as shown in FIG. 8B. The gate electrode extends in a direction perpendicular to the paper (i.e., word line direction), and a plurality memory cells of the same structure are formed in a plurality other cross sections parallel to the paper to form a cell array.

In the next step, source-drain diffusion regions 706 are formed by, for example, an ion implantation method. Then, an interlayer insulating film 731 is formed thereon. Further, a conductive material consisting of a bit line 711, a memory node 721 constituting a capacitor for storing an electric charge, a plate electrode 723 and a dielectric film 722 is formed, as shown in FIG. 8B. Further, another interlayer insulating film 732 is formed on the structure noted above, followed by forming an aluminum wiring 712 and subsequently forming still another interlayer insulating film 733 as shown in FIG. 8B, thereby finishing formation of the DRAM section.

Figure 9A:
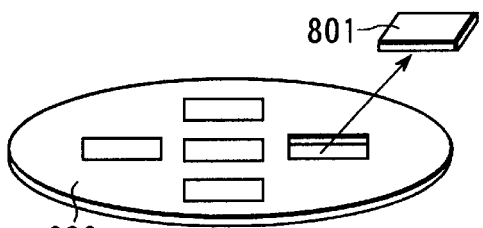
FIG. 9A is an oblique view showing a holder board.
Figure 9B:
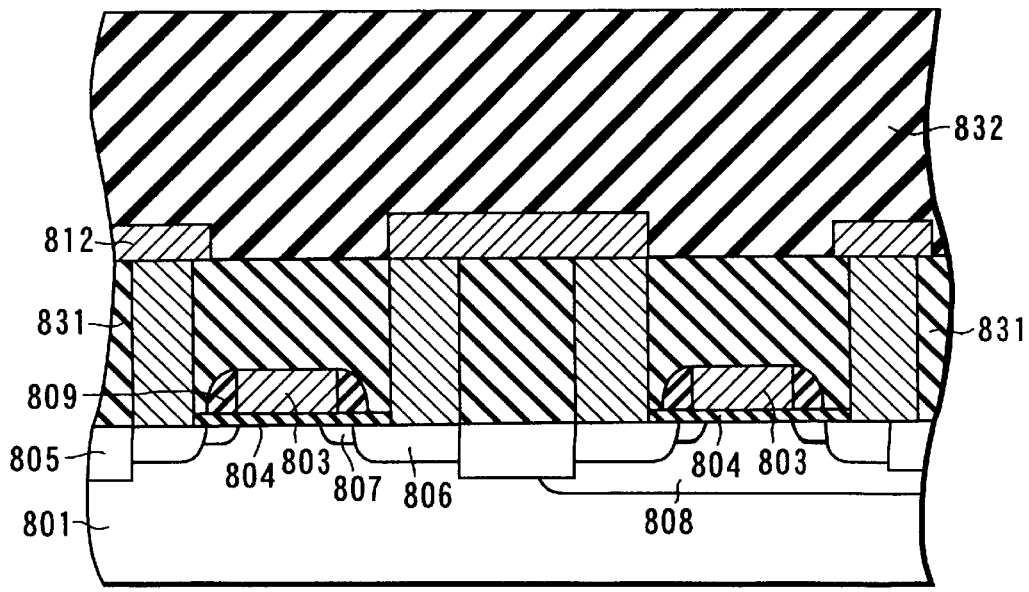
FIG. 9B is a partial cross sectional view showing a semiconductor substrate on which a semiconductor device having a logic function is formed.

FIG. 9A shows that a plurality of semiconductor substrates 801 are mounted to a holder board 802 differing from the holder board 702 shown in FIG. 8A. On the other hand, FIG. 9B is a partial cross sectional view of a CMOSFET constituting a logic circuit formed by a known method on a main surface of the semiconductor substrate 801. Let us describe how to manufacture the CMOS section with reference to these drawings.

In the first step, a well region 808 with a conductivity type opposite to that of the substrate 801 is formed on a main surface of the semiconductor substrate 801, as shown in FIG. 9B. Then, an device isolation film 805 is formed by a shallow trench isolation technique on the main surface of the semiconductor substrate 801, followed by forming a thin gate oxide film 804 and a gate electrode 803 for a logic circuit.

In the next step, shallow source-drain diffusion regions 807 are formed by, for example, an ion implantation. Then, a gate side wall 809 is formed by a CVD method and a RIE method, etc. as shown in FIG. 9B, followed by forming deep source-drain diffusion regions 806 by, for example, an ion implantation method.

After formation of the deep source-drain diffusion regions 806, an interlayer insulating film 831 is formed thereon. Then, an aluminum wiring 812 and contact serving to mutually connect individual MOSFET constituting a logic circuit of the same construction is formed, followed by forming another interlayer insulating film 832, thereby finishing the manufacturing process of a logic circuit section.

It should be noted that, in carrying out a series of manufacturing steps which are difficult to be carried out commonly, the semiconductor substrates used for forming a DRAM section and the semiconductor substrates used for forming a logic section are mounted to the separate holder boards 702 and 802, respectively. When the manufacturing steps which can be carried out commonly have been reached, the semiconductor substrates 701 and 801 are detached from the holder boards 702 and 802, respectively.

Figures 10A, 10B:
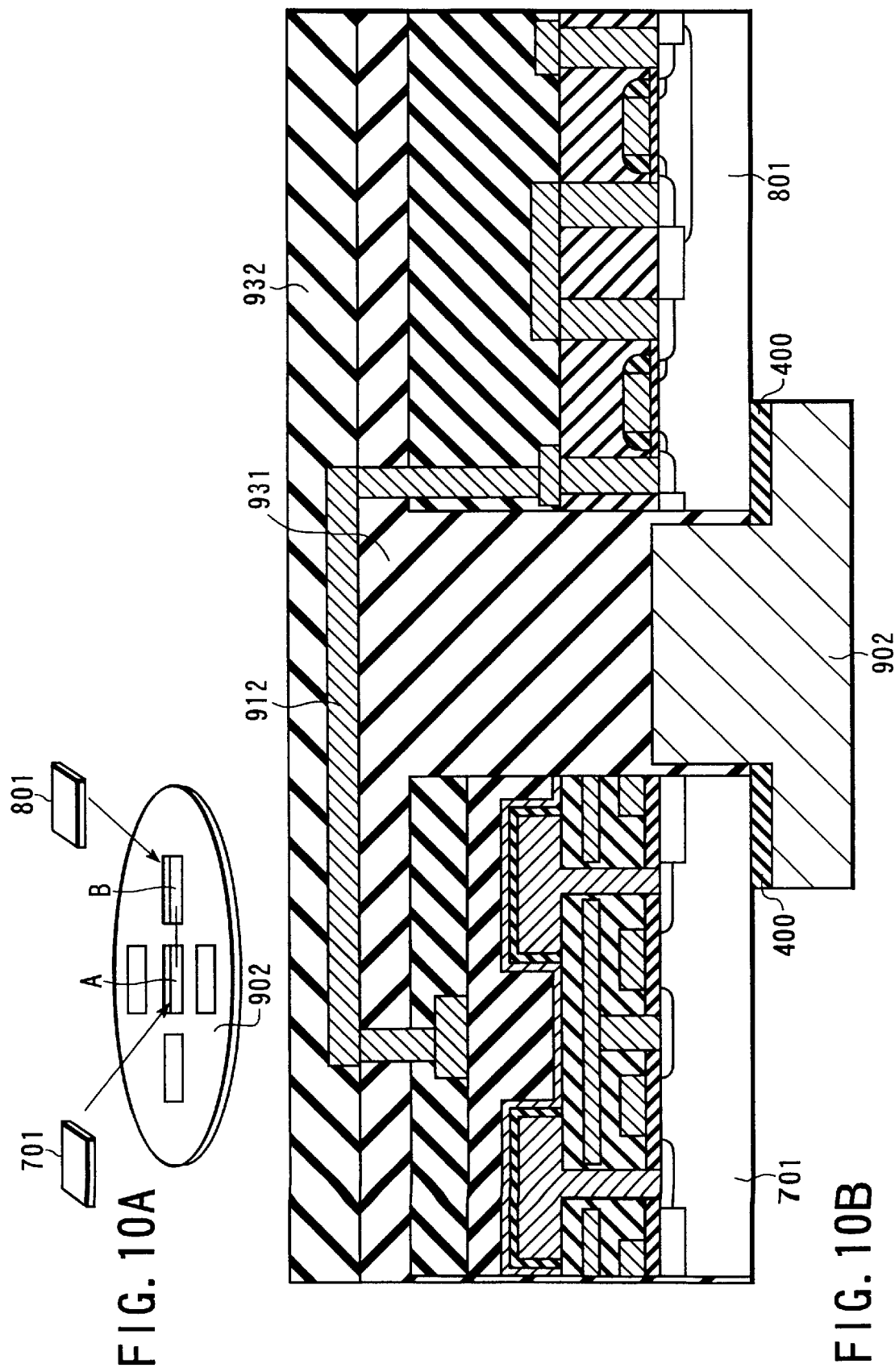
FIG. 10A is an oblique view showing a holder board prepared by bonding two semiconductor substrates having semiconductor circuit devices, which differ from each other, formed thereon.
FIG. 10B is a cross sectional view showing the state that a common process of manufacturing a semiconductor element is applied to the holder board shown in FIG. 10A.

FIG. 10A shows that the semiconductor substrates 701 and 801 shown in FIGS. 8A, 8B and FIGS. 9A, 9B, respectively are mounted to a holder board 902. On the other hand, FIG. 10B shows in a magnified fashion the cross section along the line XXB—XXB shown in FIG. 10A.

In the first step, a composite substrate is prepared by mounting the semiconductor substrates 701 and 801 to the holder board 902 with an insulating film 400 interposed therebetween making use of any of the bonding methods described previously. Then, formed is an interlayer insulating film covering both the semiconductor device formed on the main surface of the semiconductor substrate 701 and the semiconductor device formed on the main surface of the semiconductor substrate 801, as shown in FIG. 10B. After formation of the interlayer insulating film, an aluminum wiring 912 serving to connect these semiconductor devices is formed, followed by forming a passivation film 932 covering the entire surface of the composite substrate including the aluminum wiring 912, thereby finishing the manufacture of a desired semiconductor device in which two semiconductor substrates are combined to form a single chip.

As described above, in the conventional method of manufacturing a one chip type semiconductor device in which a plurality of electronic circuits of widely differing function are formed in a single chip, it is difficult to carry out a common manufacturing step for achieving these different functions, leading to a high manufacturing cost. In the method of the present invention, however, different semiconductor substrates to which different manufacturing steps have been applied independently are mounted to the same holder board 902 when common manufacturing steps can be applied to these different semiconductor substrates so as to achieve finally a one chip type semiconductor device.

In the present invention, each manufacturing step can be set up to achieve a single desired function, making it unnecessary to satisfy simultaneously contradictory conditions. It follows that the manufacturing process can be controlled easily, with the result that a one chip type semiconductor device can be manufactured at a low cost without increasing the number of required process steps and without making the process step complex.

Needless to say, it is unnecessary for the semiconductor substrates 701 and 801 to be formed of the same semiconductor material. In other words, these substrates 701 and 801 may be formed of different kinds of semiconductor materials. It is also possible to use a material different from a semiconductor material as far as problems related to thermal characteristics can be solved. Further, in the embodiment described above, the final one chip type semiconductor device is comprised of two semiconductor substrates. However, three or more semiconductor substrates can be incorporated in the final one chip type semiconductor device manufactured by the method of the present invention. Still further, it is effective to form an additional protective film on the back surface of the composite substrate in order to facilitate the cutting out of the final semiconductor device.

Of course, the timing of mounting different semiconductor substrates to a single holder board need not be limited to that in the embodiment described above. In other words, the different semiconductor substrates can be mounted to a s ingle holder board whenever a common manufacturing step can be applied to the different semiconductor substrates before the completion of the manufacturing process of the final product.

Further, the method of the present invention makes it possible to manufacture a one chip type semiconductor device in which a multi-functional electronic circuit is formed over the entire composite substrate. Even in this case, the yield can be drastically improved by removing and discarding appropriately the defective semiconductor substrate and substituting therefor a functional semiconductor substrate.

As described above in detail, a plurality of semiconductor substrates are detachably mounted independently to a holder board in the method of the present invention so as to permit mass production of a semiconductor device while achieving an improved through out derived from a collective processing over a large area. In addition, a mass production facility need not be newly constructed every time a holder board of a larger diameter is used, which permits a flexible capital investment.

What should also be noted is that, in forming a plurality of electronic circuits widely differing from each other in function such as a memory circuit and a logic circuit on a single chip, the one chip semiconductor device comprising these electronic circuits can be manufactured at a low cost without increasing the number of required manufacturing steps and without making the manufacturing step complex.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A method of manufacturing a semiconductor device, comprising the steps of:
   detachably mounting a plurality of semiconductor substrates to a first holder board so as to constitute a complex semiconductor substrate, each of said plural semiconductor substrates being able to be handled without said first holder board; and
   subjecting the plural semiconductor substrates included in the complex semiconductor substrate to common steps of manufacturing a semiconductor device.

2. The method of manufacturing a semiconductor device according to claim 1, wherein at least one of the plural semiconductor substrates has been mounted to a second holder board differing in size from the first holder board, further comprising the steps of:
   subjecting the semiconductor substrate mounted to the second holder board to a manufacturing process of a semiconductor device;
   detaching the semiconductor substrate subjected to the manufacturing process of a semiconductor device from the second holder board; and
   bonding the semiconductor substrate detached from the second holder board to the first holder board so as to form the complex semiconductor substrate.

3. The method of manufacturing a semiconductor device according to claim 1, further comprising the steps of:
   detaching at least one of the plural semiconductor substrates from the first holder board;
   bonding the semiconductor substrate detached from the first holder board to a third holder board differing in size from the first holder board; and
   the step of subjecting the semiconductor substrate bonded to the third holder board to a manufacturing process of a semiconductor device.

4. The method of manufacturing a semiconductor device according to claim 1, wherein each of said plural semiconductor substrates comprises an upper semiconductor substrate having a main surface on which said semiconductor device is to be formed, a lower semiconductor substrate, and an insulating layer interposed between said upper semiconductor substrate and said lower semiconductor substrate.

5. The method of manufacturing a semiconductor device according to claim 1, wherein at least one of said plural semiconductor substrates is bonded to said first holder board with an insulating film interposed therebetween.

6. The method of manufacturing a semiconductor device according to claim 5, wherein said insulating film consists of a silicon oxide film.

7. The method of manufacturing a semiconductor device according to claim 5, wherein said insulating film is bonded to said at least one of said plural semiconductor substrates or said first holder board by covalent bond.

8. The method of manufacturing a semiconductor device according to claim 5, wherein said insulating film is bonded to said at least one of said plural semiconductor substrates or said first holder board by hydrogen bond involving an OH group.

9. The method of manufacturing a semiconductor device according to claim 8, wherein a heat treatment is applied to the bonded structure between said at least one of said plural semiconductor substrates and the first holder board so as to bring about a dehydration-reaction and, thus, to convert the hydrogen bond involving the OH group into a chemical covalent bond.

10. The method of manufacturing a semiconductor device according to claim 6, wherein said at least one of said plural semiconductor substrates is bonded to the first holder board by intermolecular force.

11. The method of manufacturing a semiconductor device according to claim 4, further comprising the step of forming a silicon oxide film having a hydrophilic surface on either adjoining surface of at least one of said plural semiconductor substrates or said holder board prior to the mounting step.

12. The method of manufacturing a semiconductor device according to claim 6, further comprising the step of forming a silicon layer on the bonding surface of any of said at least one of the plural semiconductor substrates and said holder board prior to the mounting step, wherein said mounting step comprises converting said silicon layer into said silicon oxide film so as to achieve bonding between said at least one of said plural semiconductor substrates and the holder board.

13. The method of manufacturing a semiconductor device according to claim 6, further comprising the step of coating the bonding surface of any of said at least one of the plural semiconductor substrates and said holder with a fluid silicon oxide prior to the mounting step, wherein said mounting step comprises applying a heat treatment to said silicon oxide so as to achieve bonding between said at least one of said plural semiconductor substrates and the holder board.

14. The method of manufacturing a semiconductor device according to claim 6, further comprising the steps of attaching fine particles having silicon oxide exterior to the bonding surface of any of said at least one of said plural semiconductor substrates and said holder board prior to the mounting step, wherein said mounting step comprises compressing said at least one of said plural semiconductor substrates and the holder board.

15. The method of manufacturing a semiconductor device according to claim 1, wherein said holder board is formed of a material having an equal thermal expansion coefficient to that of the material of said plural semiconductor substrates.

16. The method of manufacturing a semiconductor device according to claim 4, wherein said holder board is formed of identical material to the material of said lower semiconductor substrate.

17. The method of manufacturing a semiconductor device according to claim 5, further comprising the step of detaching said at least one of said plural semiconductor substrates from said holder board by removing said insulating film by etching.

18. The method of manufacturing a semiconductor device, comprising the steps of:
mounting a plurality of semiconductor substrates to a holder board so as to constitute a complex semiconductor substrate, said plural semiconductor substrates being electrically insulated from each other and from said holder board; and
subjecting the complex semiconductor to common manufacturing step by independently controlling the electric potential of the plural semiconductor substrates included in the complex semiconductor substrate.

19. The method of manufacturing a semiconductor device according to claim 18, wherein said plural semiconductor substrates are detachably mounted to said holder board.

20. The method of manufacturing a semiconductor device according to claim 18, wherein each of said plural semiconductor substrates comprises an upper semiconductor substrate having a main surface on which said semiconductor device is to be formed, a lower semiconductor substrate, and an insulating layer interposed between said upper semiconductor substrate and said lower semiconductor substrate.

21. The method of manufacturing a semiconductor device according to claim 18, wherein at least one of said plural semiconductor substrates is mounted to said holder board with a silicon oxide file interposed therebetween.

22. The method of manufacturing a semiconductor device according to claim 18, wherein a semiconductor device is formed over a plurality of said semiconductor substrates.

23. The method of manufacturing a semiconductor device according to claim 1, wherein said holder board can be used repeatedly.

24. The method of manufacturing a semiconductor device according to claim 1, wherein said mounting step is performed such that said plural semiconductor substrates are individually detachable from said holder board.

25. The method of manufacturing a semiconductor device according to claim 1, further comprising the step of detaching a part of said plural semiconductor substrates from said holder board.

26. The method of manufacturing a semiconductor device according to claim 1, further comprising the step of forming a silicon oxide film having a hydrophilic surface on either adjoining surface of at least one of said plural semiconductor substrates or said holder board prior to the mounting step.

27. The method of manufacturing a semiconductor device according to claim 18, wherein each of said plural semiconductor substrates can be handled without said holder board.

28. The method of manufacturing a semiconductor device according to claim 18, wherein subjecting step is performed such that a semiconductor element is formed on an exposed surface of each of said plural semiconductor substrates.

* * * * *